United States Patent
Lee et al.

(10) Patent No.: US 10,050,091 B2
(45) Date of Patent: Aug. 14, 2018

(54) DISPLAY DEVICE CAPABLE OF GENERATING ELECTRICITY

(71) Applicant: SAMSUNG DISPLAY CO., LTD., Yongin-si, Gyeonggi-Do (KR)

(72) Inventors: Taehee Lee, Gumi-si (KR); Myungim Kim, Yongin-si (KR); Hongshik Shim, Seoul (KR); Yong-Suk Yeo, Seongnam-si (KR); Byunghan Yoo, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/196,167

(22) Filed: Jun. 29, 2016

(65) Prior Publication Data
US 2017/0005147 A1    Jan. 5, 2017

(30) Foreign Application Priority Data
Jul. 1, 2015  (KR) .................. 10-2015-0094294

(51) Int. Cl.
*F21V 7/04*  (2006.01)
*H01L 27/32*  (2006.01)
*F21V 8/00*  (2006.01)
*H01L 27/16*  (2006.01)
*H01L 35/32*  (2006.01)

(52) U.S. Cl.
CPC ........ *H01L 27/3225* (2013.01); *G02B 6/0081* (2013.01); *H01L 27/16* (2013.01); *H01L 35/32* (2013.01)

(58) Field of Classification Search
CPC ....................................... F21V 7/04
USPC .................. 362/611, 612, 615, 600
See application file for complete search history.

(56) References Cited

U.S. PATENT DOCUMENTS

| | | | | |
|---|---|---|---|---|
| 6,122,185 | A * | 9/2000 | Utsunomiya | G04C 10/00 363/60 |
| 2005/0088588 | A1* | 4/2005 | Lee | F21V 29/00 349/65 |
| 2006/0274223 | A1* | 12/2006 | Hsu | G02B 6/0031 349/58 |
| 2008/0259071 | A1* | 10/2008 | Nemoto | G06F 21/316 345/212 |
| 2009/0051880 | A1* | 2/2009 | Ito | G02F 1/133385 353/52 |

(Continued)

FOREIGN PATENT DOCUMENTS

| | | |
|---|---|---|
| JP | 2013-152410 | 8/2013 |
| JP | 2014153392 | 8/2014 |

(Continued)

*Primary Examiner* — Edwyn Labaze
(74) *Attorney, Agent, or Firm* — F. Chau & Associates, LLC

(57) ABSTRACT

A display device includes a display panel displaying an image. A light source unit provides light to the display panel. A cover member covers a portion of an upper surface of the display panel and a side surface of the display panel. The cover member exposes a display area of the display panel. A thermoelectric device is disposed between the cover member and the light source unit. The thermoelectric device contacts the cover member, and the thermoelectric device generates an electromotive force due to a difference in temperature between the light source unit and the cover member.

16 Claims, 10 Drawing Sheets

(56) References Cited

U.S. PATENT DOCUMENTS

| | | | | |
|---|---|---|---|---|
| 2011/0242742 A1* | 10/2011 | Kim | ................... | H04N 5/64 |
| | | | | 361/679.01 |
| 2011/0266544 A1* | 11/2011 | Park | ................... | H01L 27/3248 |
| | | | | 257/59 |
| 2014/0313141 A1 | 10/2014 | Park et al. | | |
| 2016/0218387 A1* | 7/2016 | Tajima | .............. | H01M 10/0431 |

FOREIGN PATENT DOCUMENTS

| KR | 1020030008507 | 1/2003 |
|---|---|---|
| KR | 1020050039925 | 5/2005 |
| KR | 1020100033048 | 3/2010 |

\* cited by examiner

DISPLAY DEVICE CAPABLE OF GENERATING ELECTRICITY

CROSS-REFERENCE TO RELATED APPLICATION(S)

This U.S. non-provisional patent application claims priority under 35 U.S.C. § 119 to Korean Patent Application No. 10-2015-0094294, filed on Jul. 1, 2015, in the Korean Intellectual Property Office, the content of which is incorporated by reference herein in its entirety.

TECHNICAL FIELD

The present invention relates to a display device. More particularly, the present invention relates to a display device capable of generating electricity.

DISCUSSION OF THE RELATED ART

Generally, display devices are classified as either non-self-emissive display devices, (e.g., liquid crystal display devices), or self-emissive display devices, (e.g., organic light emitting display devices). In the case of a non-self-emissive display device, heat is generated by a backlight unit that provides light to a display panel of the non-self emissive display device. In the case of a self-emissive display device, heat is generated by a display panel of the self-emissive display device that includes a light emitting layer.

SUMMARY

According to an exemplary embodiment of the inventive concept, a display device includes a display panel displaying an image. A light source unit provides light to the display panel. A cover member covers a portion of an upper surface of the display panel and a side surface of the display panel. The cover member exposes a display area of the display panel. A thermoelectric device is disposed between the cover member and the light source unit. The thermoelectric device contacts the cover member. The thermoelectric device generates an electromotive force due to a difference in temperature between the light source unit and the cover member.

In an exemplary embodiment of the inventive concept, the thermoelectric device includes a heat absorbing substrate absorbing heat generated from the light source unit. A semiconductor part is disposed between the heat absorbing substrate and the cover member, wherein the semiconductor part is coupled to the cover member.

In an exemplary embodiment of the inventive concept, the light source unit includes a light source emitting the light and a printed circuit board on which the light source is disposed, wherein the heat absorbing substrate directly contacts the printed circuit board.

In an exemplary embodiment of the inventive concept, the cover member includes a cover portion covering the portion of the upper surface of the display panel and a sidewall portion extending from the cover portion along the side surface of the display panel, wherein the cover member comprises a metal material.

In an exemplary embodiment of the inventive concept, the display device further includes a light guide plate disposed under the display panel, the light guide plate guiding the light provided from the light source to the display panel. The light source unit is disposed between the sidewall portion and the light guide plate. The semiconductor part is coupled to the sidewall portion.

In an exemplary embodiment of the inventive concept, the display device further includes an extrusion bar disposed between the light source unit and the sidewall portion. The extrusion bar supports the light source unit. The heat absorbing substrate directly contacts the extrusion bar.

In an exemplary embodiment of the inventive concept, the display device further includes a mold frame disposed under the display panel supporting a non-display area of the display panel. The mold frame includes a first frame portion disposed between the light source unit and the sidewall portion and a second frame portion extending from the first frame portion and disposed along a side surface of the light guide plate, wherein the semiconductor part is coupled to the sidewall portion after passing through the first frame portion.

In an exemplary embodiment of the inventive concept, the sidewall portion includes a groove receiving the semiconductor part.

According to an exemplary embodiment of the inventive concept, a display device includes a self-emissive display panel displaying an image. An accommodating member accommodates the self-emissive display panel. A thermoelectric device is disposed between the self-emissive display panel and the accommodating member. The thermoelectric device is coupled to the accommodating member. The thermoelectric device generates an electromotive force due to a difference in temperature between the self-emissive display panel and the accommodating member.

In an exemplary embodiment of the inventive concept, the thermoelectric device includes a heat absorbing substrate absorbing heat generated from the self-emissive display panel and a semiconductor part disposed between the heat absorbing substrate and the accommodating member, wherein the semiconductor part is coupled to the accommodating member.

In an exemplary embodiment of the inventive concept, the accommodating member includes a groove receiving the semiconductor part.

In an exemplary embodiment of the inventive concept, the accommodating member includes a bottom portion and a sidewall portion extending from the bottom portion, wherein the accommodating member comprises a metal material.

In an exemplary embodiment of the inventive concept, the thermoelectric device is disposed under the self-emissive display panel, the thermoelectric device being disposed between the self-emissive display panel and the bottom portion.

In an exemplary embodiment of the inventive concept, the thermoelectric device is disposed on a side surface of the self-emissive display panel, the thermoelectric device being disposed between the self-emissive display panel and the sidewall portion.

In an exemplary embodiment of the inventive concept, the heat absorbing substrate directly contacts the self-emissive display panel.

In an exemplary embodiment of the inventive concept, the heat absorbing substrate is spaced apart from the self-emissive display panel.

According to an exemplary embodiment of the inventive concept, a display device includes a display panel that displays an image. A light source unit provides light to the display panel. An accommodating member accommodates the display panel and the light source unit. The accommodating member comprises a metal material. A thermoelectric device is disposed between the accommodating member and the light source unit. The thermoelectric device contacts the accommodating member. The thermoelectric device generates an electromotive force in response to a difference in temperature between the light source unit and the accommodating member.

In an exemplary embodiment of the inventive concept, the accommodating member includes a bottom portion and a sidewall portion extending from the bottom portion.

In an exemplary embodiment of the inventive concept, the display device further includes a light guide plate disposed under the display panel to guide the light provided from the light source to the display panel. The light source unit is disposed between the sidewall portion and the light guide plate. The thermoelectric device is coupled to the sidewall portion.

In an exemplary embodiment of the inventive concept, the light source unit is disposed between the display panel and the bottom portion, wherein the thermoelectric device is coupled to the bottom portion.

BRIEF DESCRIPTION OF THE DRAWINGS

The above and other features and aspects of the present invention will become more apparent by describing in detail exemplary embodiments thereof with reference to the accompanying drawings, in which.

DETAILED DESCRIPTION OF THE EMBODIMENTS

Exemplary embodiments of the present invention will now be described more fully hereinafter with reference to the accompanying drawings. The present invention, however, is not limited to the disclosed exemplary embodiments. Those of ordinary skill in the art may recognize that various changes and modifications can be made to the exemplary embodiments described herein without departing from the spirit and scope of the present disclosure. In addition, descriptions of well-known functions and constructions may be omitted for clarity and conciseness.

Figure 1:
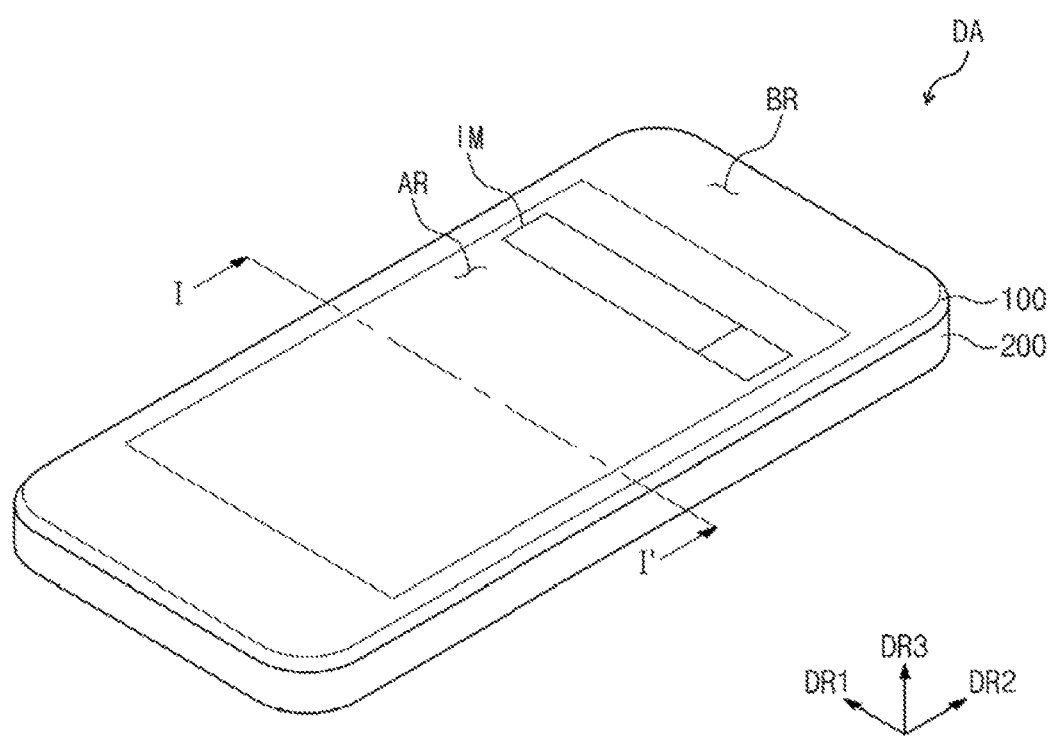
FIG. 1 is a perspective view showing a display device, according to an exemplary embodiment of the present invention.

FIG. 1 is a perspective view showing a display device, according to an exemplary embodiment of the present invention.

FIG. 1 shows a flat mobile terminal as a display device DA. However, the display device DA, according to the present invention, should not be limited to the flat mobile terminal. For example, the display device DA may be applied to various displays such as a curved display device, a bending-type display device, a rollable display device, a foldable display device, a stretchable display device, etc. The display device DA, according to an exemplary embodiment of the present invention, may be applied to a large-sized electronic item, such as a television set, an outdoor billboard, etc. According to an exemplary embodiment of the present invention, the display device DA may be applied to small and medium-sized electronic items, such as a personal computer, a notebook computer, a personal digital assistant, a car navigation unit, a game unit, a mobile electronic device, a wrist-type electronic device, a camera, etc., but it should not be limited thereto or thereby.

The display device DA includes a plurality of areas distinct from each other on a display surface. The display device DA includes a display area AR in which an image IM is displayed and a non-display area BR disposed adjacent to the display area AR. The display surface on which the image IM is displayed is substantially parallel to a surface defined by a first direction DR1 and a second direction DR2. A third direction DR3 is normal (e.g., perpendicular) to the display surface on which the image IM is displayed. The third direction DR3 corresponds to a reference axis used to distinguish a front surface from a rear surface of each member, component, or element.

Figure 2:
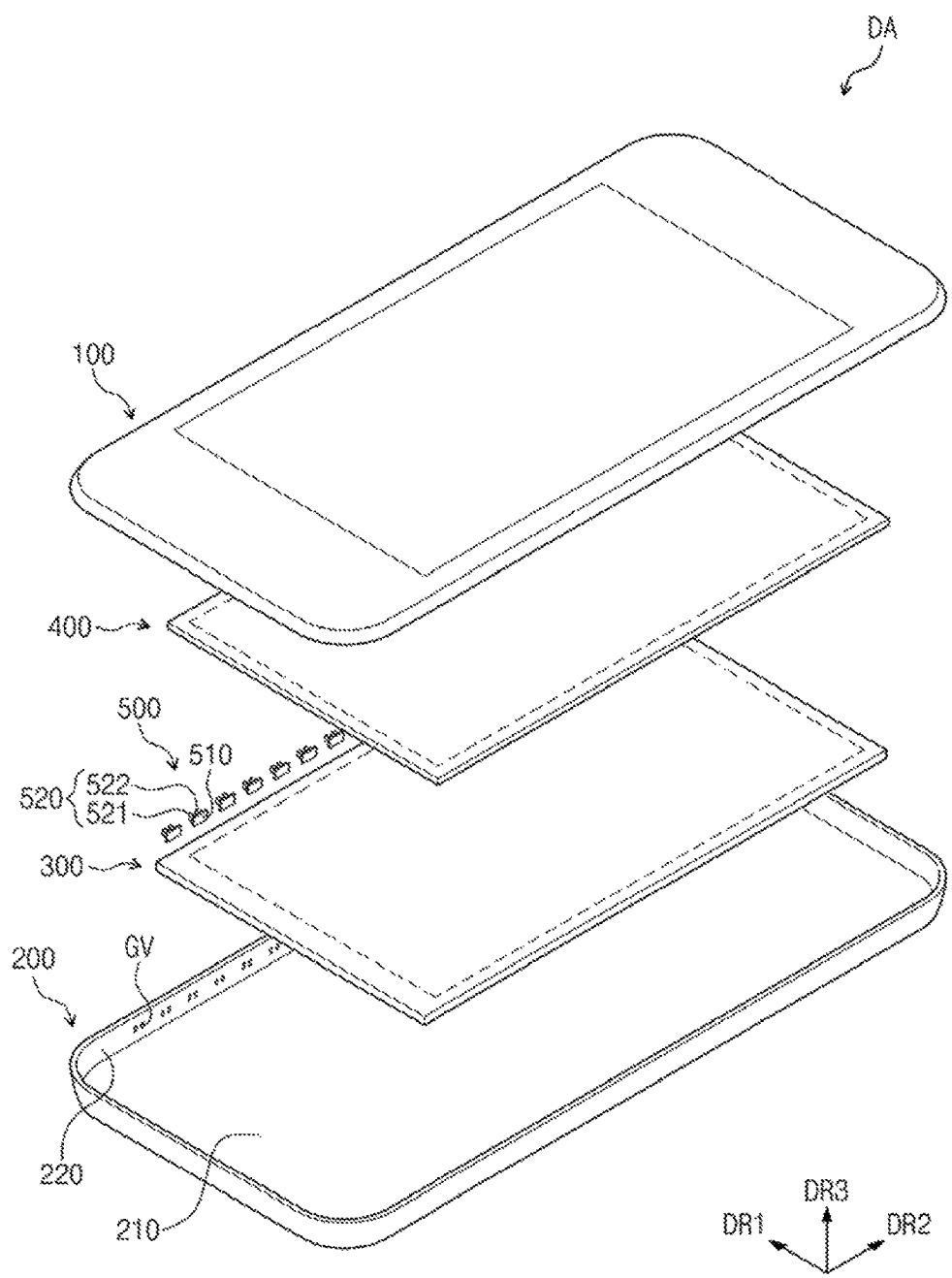
FIG. 2 is an exploded perspective view showing a display device, according to an exemplary embodiment of the present invention.
Figure 3:
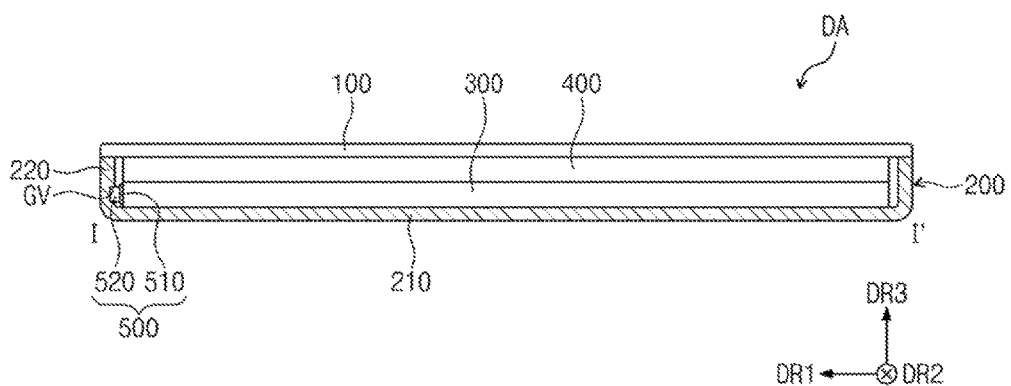
FIG. 3 is a cross-sectional view taken along line I-I' of FIG. 1, showing a display device, according to an exemplary embodiment of the present invention.

FIG. 2 is an exploded perspective view showing a display device, according to an exemplary embodiment of the present invention. FIG. 3 is a cross-sectional view taken along line I-I' of FIG. 1, showing a display device, according to an exemplary embodiment of the present invention.

Referring to FIGS. 2 and 3, the display device DA includes a window member 100, an accommodating member 200, a display panel 300, a touch panel 400, and a thermoelectric device 500. Each of the window member 100, the display panel 300, and the touch panel 400 includes areas corresponding to the display area AR (refer to FIG. 1) and the non-display area BR (refer to FIG. 1) of the display device DA when viewed in a plan view.

The window member 100 may include a base member and a black matrix. The base member includes one of a silicon substrate, a glass substrate, a sapphire substrate, and a plastic film, but it should not be limited thereto or thereby. The black matrix is disposed on a rear surface of the base member to define a bezel area of the display device DA, (e.g., the non-display area BR, refer to FIG. 1). The black matrix may be a colored organic layer and formed by a coating process. In addition, the window member 100 may further include a functional coating layer disposed on a front surface of the base member. The functional coating layer may include a fingerprint prevention layer, an anti-reflection layer, and a hard coating layer.

The accommodating member 200 accommodates the display panel 300 and the thermoelectric device 500 and is coupled to the window member 100. The accommodating member 200 may include a metal material, but it should not be limited thereto or thereby. The accommodating member 200 may include a material having a high heat conductivity. The accommodating member 200 includes a bottom portion 210 and a sidewall portion 220 extending in the third direction DR3 from the bottom portion 210. In an exemplary embodiment of the present invention, the accommodating member 200 is formed in a single body, but it should not be limited thereto or thereby. For example, the accommodating member 200 may be formed by assembling together a plurality of various parts.

The display panel 300 generates the image corresponding to image data input thereto. In an exemplary embodiment of the present invention, the display panel 300 may be a self-emissive display panel such as an organic light emitting display panel. However, the present invention is not limited thereto. In an exemplary embodiment of the present invention, the display panel 300 may be a liquid crystal display panel. Heat may be generated from an organic light emitting device layer included in the display panel 300. The heat generated from the display panel 300 may be used as an auxiliary power source.

The touch panel 400 calculates coordinate information of a touch position. The touch panel 400 is disposed on an upper surface of the display panel 300. The touch panel 400 may be a resistive layer type touch panel, an electrostatic capacitive type touch panel, or an electromagnetic induction type touch panel. In an exemplary embodiment of the present invention, the electrostatic capacitive type touch panel will be described as the touch panel 400. The touch panel 400 includes two kinds of sensors crossing each other. The electrostatic capacitive type touch panel obtains the coordinate information of the touch position by a self capacitance measurement method or a mutual capacitance measurement method.

The thermoelectric device 500 generates an electromotive force using a difference in temperature between the display panel 300 and the accommodating member 200. Since the heat is generated from the organic light emitting device layer of the display panel 300, the display panel 300 serves as a heat source. In addition, the accommodating member 200 includes a metal material having a high heat conductivity, and thus the accommodating member 200 serves as a heat sink. The thermoelectric device 500 generates the electromotive force between the display panel 300 serving as the heat source and the accommodating member 200 serving as the heat sink.

The thermoelectric device 500 includes a heat absorbing substrate 510 and a semiconductor part 520. The semiconductor part 520 includes a p-type thermoelectric semiconductor 521 and an n-type thermoelectric semiconductor 522.

The heat absorbing substrate 510 absorbs the heat generated from the display panel 300. The heat absorbing substrate 510 is disposed to make contact with the display panel 300 or to be spaced apart from the display panel 300. In an exemplary embodiment of the present invention, the thermoelectric device 500 is disposed between a side surface of the display panel 300 and the sidewall portion 220. Accordingly, the heat absorbing substrate 510 is disposed on the side surface of the display panel 300. In the case that the heat absorbing substrate 510 directly makes contact with the display panel 300, the heat absorbing substrate 510 may absorb the heat conducted from the display panel 300. In the case that the heat absorbing substrate 510 is spaced apart from the display panel 300, the heat absorbing substrate 510 may absorb the heat that is radiated from the display panel 300.

The semiconductor part 520 is disposed between the heat absorbing substrate 510 and the accommodating member 200. The semiconductor part 520 is coupled to the accommodating member 200. In an exemplary embodiment of the present invention, the accommodating member 200 is provided with a groove GV into which the semiconductor part 520 is inserted.

When the display device DA operates, a temperature at a first end of each of the p-type thermoelectric semiconductor 521 and the n-type thermoelectric semiconductor 522 is higher than a temperature at a second end of each of the p-type thermoelectric semiconductor 521 and the n-type thermoelectric semiconductor 522. This is so because the first ends of the p-type and n-type thermoelectric semiconductors 521 and 522 are connected to the heat absorbing substrate 510 and the second ends of the p-type and n-type thermoelectric semiconductors 521 and 522 are connected to the accommodating member 200. In this case, an electromotive force is generated by the temperature difference between the first and second ends of each of the p-type thermoelectric semiconductor 521 and the n-type thermoelectric semiconductor 522, and an electric current occurs. The phenomenon in which the electromotive force is generated due to the difference in temperature between the first and second ends of the semiconductor part 520 and the current flow resulting from the electromotive force is called Seebeck effect.

Since the accommodating member 200 formed of the metal material that has a high heat conductivity, the temperature of the accommodating member 200 may be lower than that of the display panel 300 in an operational state. Therefore, when the heat is applied to the heat absorbing substrate 510, electrons of the n-type thermoelectric semiconductor 522 move to the accommodating member 200 by the heat applied thereto, and holes of the p-type thermoelectric semiconductor 521 move to the accommodating member 200.

Although not shown in figures, the accommodating member 200 may further include a metal wire disposed thereon to electrically connect the p-type thermoelectric semiconductor 521 and the n-type thermoelectric semiconductor 522. When assuming that the thermoelectric device 500 is a single unit, thermoelectric devices 500 may be connected to each other in series or in parallel. The current generated by the temperature difference may flow to an external circuit. The external circuit may correspond to a driving circuit driving the display panel 300, a driving circuit driving the touch panel 400, a charging circuit charging a battery, or the like. For example, the battery is a battery that powers the display device.

Figure 4:
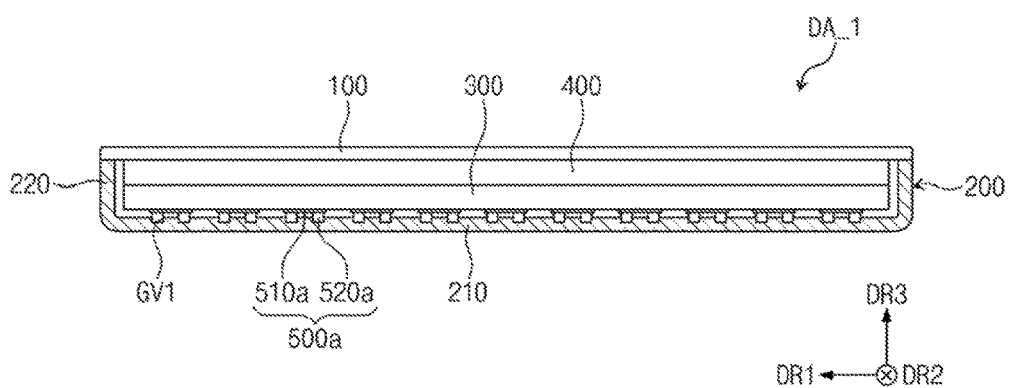
FIG. 4 is a cross-sectional view showing a display device, according to an exemplary embodiment of the present invention.

FIG. 4 is a cross-sectional view showing a display device, according to an exemplary embodiment of the present invention.

A display device DA_1 has the same structure and function as those of the display device DA (refer to FIG. 2) except for a position of a thermoelectric device 500a.

The thermoelectric device 500a is disposed under the display panel 300. For example, the thermoelectric device 500a is disposed between a rear surface of the display panel 300 and the bottom portion 210. A heat absorbing substrate 510a is disposed adjacent to the rear surface of the display panel 300 and a semiconductor part 520a is coupled to the bottom portion 210. In an exemplary embodiment of the present invention, the bottom portion 210 is provided with a groove GV1 to which the semiconductor part 520a is coupled.

The thermoelectric device 500a generates an electromotive force on the basis of the difference between the higher temperature of the display panel 300 and the lower temperature of the bottom portion 210 (e.g., when the display device DA_1 is in operation, the temperature of the display panel 300 may be higher than that of the bottom portion 210). The electromotive force generated by the temperature difference may be used to drive the display panel 300, to drive the touch panel 400, to charge a battery, or the like. Thus, a duration of the battery may be increased and/or a power consumption of the display device DA_1 on the battery may be decreased.

Figure 5:
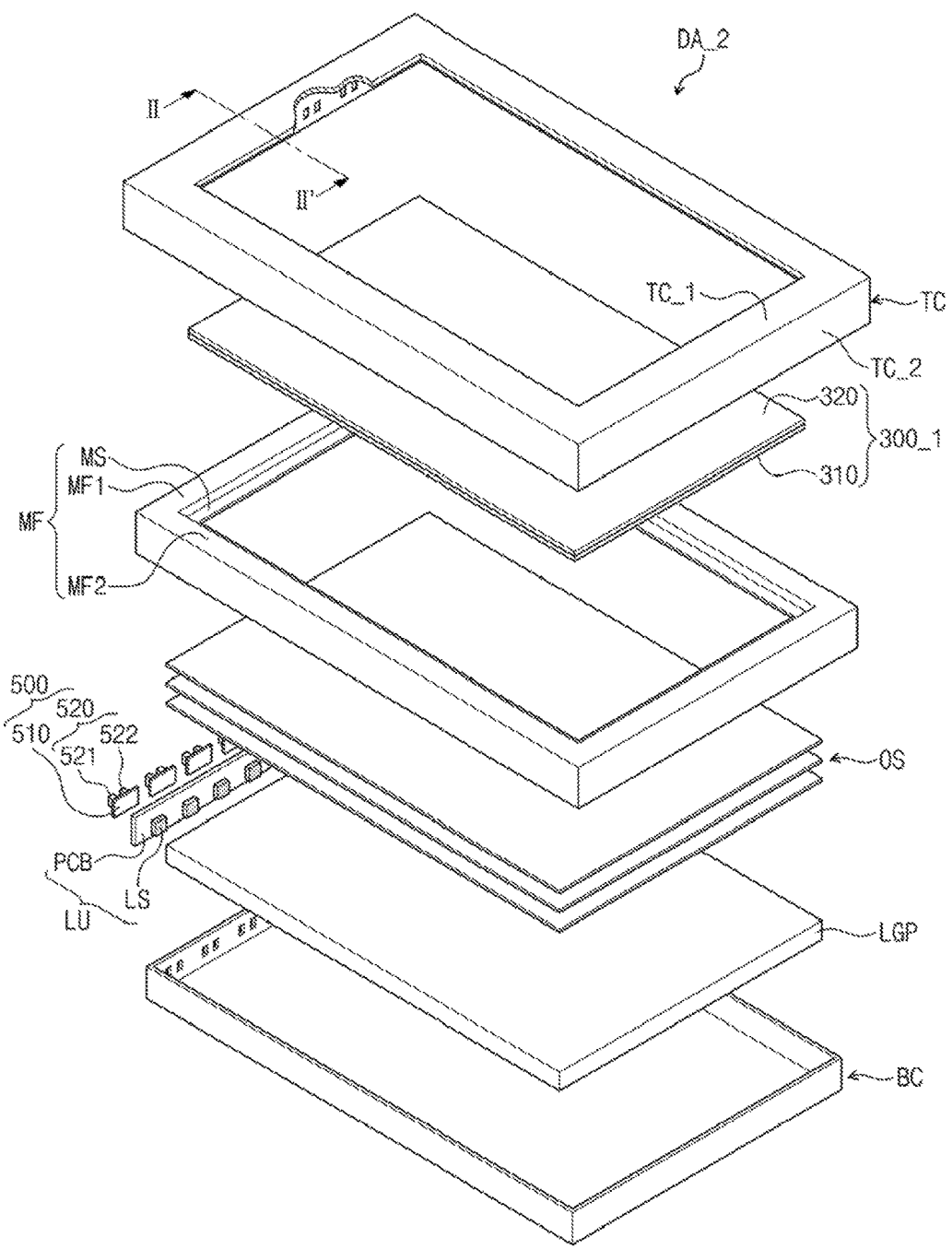
FIG. 5 is an exploded perspective view showing a display device, according to an exemplary embodiment of the present invention.
Figure 6:
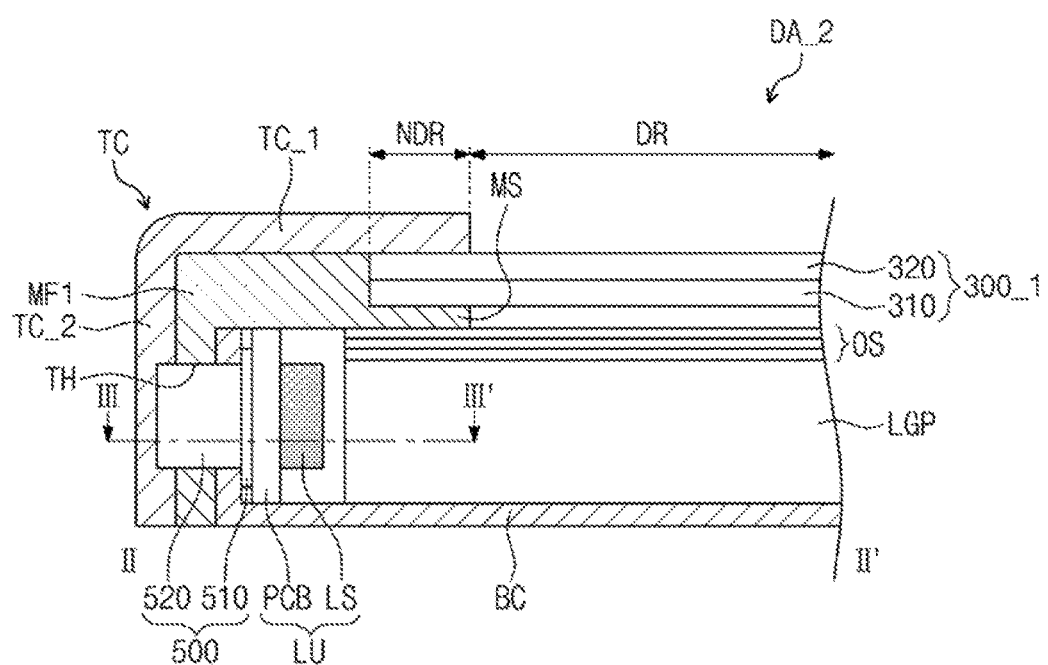
FIG. 6 is a cross-sectional view taken along line II-II' of FIG. 5, showing a display device, according to an exemplary embodiment of the present invention.
Figure 7:
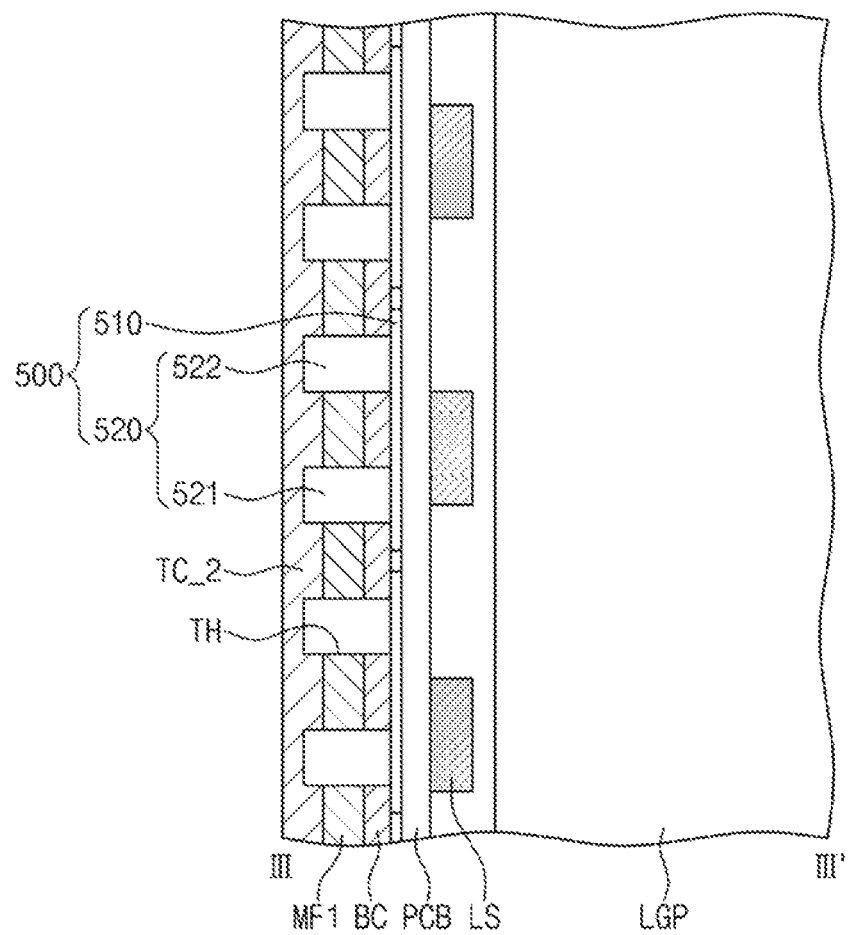
FIG. 7 is a cross-sectional view taken along line III-III' of FIG. 6, showing a display device, according to an exemplary embodiment of the present invention.

FIG. 5 is an exploded perspective view showing a display device, according to an exemplary embodiment of the present invention. FIG. 6 is a cross-sectional view taken along line II-II' of FIG. 5, showing a display device, according to an exemplary embodiment of the present invention. FIG. 7 is a cross-sectional view taken along line III-III' of FIG. 6, showing a display device, according to an exemplary embodiment of the present invention.

Referring to FIGS. 5, 6, and 7, a display device DA_2 includes a display panel 300_1, a cover member TC, a light source unit LU, a light guide plate LGP, optical sheets OS, a bottom chassis BC, a mold frame MF, and the thermoelectric device 500.

The display panel 300_1 displays an image. The display panel 300_1 may be a non-self-emissive display panel. However, the present inventive concept is not limited thereto. According to an exemplary embodiment of the present invention, the display panel 300_1 is a non-self-emissive display panel. Accordingly, a separate backlight unit may be required to provide light to the display panel 300_1. In an exemplary embodiment of the present invention, a liquid crystal display panel will be described in detail as the display panel 300_1.

The display panel 300_1 may have a substantially rectangular plate shape with two pairs of sides. In an exemplary embodiment of the present invention, the display panel 300_1 has a substantially rectangular shape with a pair of long sides and a pair of short sides. The display panel 300_1 includes a display substrate 310, an opposite substrate 320 facing the display substrate 310, and a liquid crystal layer interposed between the display substrate 310 and the opposite substrate 320. The display panel 300_1 includes a display area DR displaying an image and a non-display area NDR surrounding the display area DR, when viewed in a plan view. The image is not displayed in the non-display area NDR.

The cover member TC is disposed on the display panel 300_1 and includes a metal material. The cover member TC includes a cover portion TC_1 covering the non-display area NDR and a sidewall portion TC_2 extending from the cover portion TC_1 along a side surface of the display panel 300_1. The cover member TC is coupled to the bottom chassis BC, supports an edge of the display panel 300_1, and includes a display window formed therethrough to expose the display area DR of the display panel 300_1.

The light source unit LU is disposed adjacent to one side portion of the light guide plate LGP and provides the light to the light guide plate LGP. The light source unit LU includes a light source LS emitting light and a printed circuit board PCB on which the light source LS is mounted. The light source LS receives a driving voltage from the printed circuit board PCB. The light guide plate LGP guides the light provided from the light source LS to the display panel 300_1.

When the light source unit LU provides light to the display panel 300_1, heat is generated from the light source unit LU. In an exemplary embodiment of the present invention, the heat generated from the light source unit LU may be used as an auxiliary power source. This will be described in detail later.

The optical sheets OS are disposed between the light guide plate LGP and the display panel 300_1. The optical sheets OS control an optical path of the light guided by the light guide plate LGP. The optical sheets OS include a diffusion sheet, a prism sheet, and a protection sheet. The diffusion sheet diffuses the light and the prism sheet condenses the light diffused by the diffusion sheet to allow the light to travel in a direction substantially parallel to a normal direction of the display panel 300_1. For example, after passing through the prism sheet, light travels at a direction substantially perpendicular to a surface of the display panel 300_1. The protection sheet protects the prism sheet from external impacts. In an exemplary embodiment of the present invention, the optical sheets OS include one diffusion sheet, one prism sheet, and one protection sheet, but they should not be limited thereto or thereby. For example, at least one of the diffusion sheet, the prism sheet, and the protection sheet of the optical sheets OS may be provided in a plural number. In addition, one or more sheets of the optical sheets OS may be omitted when needed. In addition, according to an exemplary embodiment of the present invention, the light guide plate LGP may perform functions of the optical sheets OS by having patterns formed on the light guide plate LGP.

The bottom chassis BC is disposed on a rear surface of the light guide plate LGP. The bottom chassis BC is coated with a reflective material. In this case, the light traveling to the bottom chassis BC is reflected by the bottom chassis BC, and then is re-incident to the display panel 300_1. According to an exemplary embodiment of the present invention, a reflective sheet may be disposed between the light guide plate LGP and the bottom chassis BC.

The thermoelectric device 500 is disposed between the cover member TC and the light source unit LU. The thermoelectric device 500 is disposed between the sidewall portion TC_2 and the light source unit LU. The heat absorbing substrate 510 directly makes contact with the printed circuit board PCB and the semiconductor part 520 is coupled to the sidewall portion TC_2.

The heat absorbing substrate 510 absorbs the heat generated from the light source unit LU. When the light source unit LU generates light, a temperature at a first end of the semiconductor part 520, which is adjacent to the heat absorbing substrate 510, rises. Since the sidewall portion TC_2 includes a metal material, the sidewall portion TC_2 has a high heat conductivity. In addition, the temperature of the sidewall portion TC_2 is lower than the temperature of the heat absorbing substrate 510. Therefore, a temperature at a second end of the semiconductor part 520, which is coupled to the sidewall portion TC_2, is lower than the temperature of the first end of the semiconductor part 520. The thermoelectric device 500 generates the electromotive force according to the difference in temperature between the first and second ends of the semiconductor part 520, (e.g., due to the Seebeck effect). The electromotive force generated by the temperature difference may be used to drive the display panel 300_1 or to charge a battery of an electronic device, for example, a notebook computer, which is electrically connected to the thermoelectric device 500 of the display panel 300_1. Thus, a duration of the battery may be increased and a power consumption of the display device DA_2 on the battery may be reduced.

The mold frame MF supports the non-display area NDR of the display panel 300_1. The mold frame MF includes a first frame portion MF1, a second frame portion MF2, and a support portion MS. The first frame portion MF1, the second frame portion MF2, and the support portion MS are formed in a single body.

The first frame portion MF1 is disposed between the light source unit LU and the sidewall portion TC_2. The second frame portion MF2 extends from the first frame portion MF1 to surround a side surface of the light guide plate LGP. For example, the first frame portion MF1 is disposed to face a light incident surface of the light guide plate LGP and the second frame portion MF2 is disposed to face another side surface of the light guide plate LGP. The support portion MS is protruded from each of the first and second frame portions MF1 and MF2 and supports the non-display area NDR of the display panel 300_1.

The semiconductor part 520 penetrates through the first frame portion MF1 to directly connect the heat absorbing substrate 510 and the sidewall portion TC_2. For example, the thermoelectric device 500 penetrates through a thru-hole TH formed through the first frame portion MF1 and the sidewall portion TC_2 of the bottom chassis TC to directly connect the light source unit LU corresponding to the heat source and the sidewall portion TC_2 corresponding to the heat sink. Since the thermoelectric device 500 directly makes contact with the heat source and the heat sink, efficiency of the thermoelectric device 500 may be increased. The thru-hole TH may extend to the sidewall portion TC_2. In this case, the sidewall portion TC_2 is provided with a groove into which the semiconductor part 520 is inserted.

The thermoelectric device 500 generates the electromotive force due to the difference in temperature between the light source unit LU and the sidewall portion TC_2. The electromotive force generated by the temperature difference is used to drive the display panel 300_1 and to charge the battery. Accordingly, the duration of the battery use may be increased and power consumption of the display device DA_2 may be reduced.

According to an exemplary embodiment of the present invention, the display device DA_2 may further include an extrusion bar. The extrusion bar may be disposed between the light source unit LU and the first frame portion MF1 to support the light source unit LU. In this case, the heat absorbing substrate 510 may directly make contact with the extrusion bar. The extrusion bar may transfer the heat to the heat absorbing substrate 510.

Figure 8:
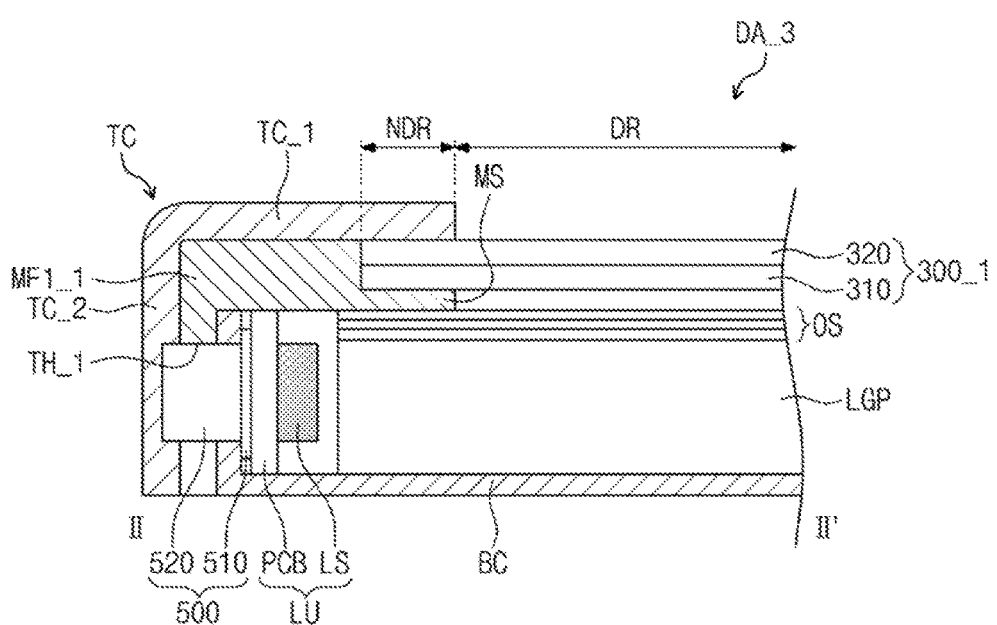
FIG. 8 is a cross-sectional view showing a display device, according to an exemplary embodiment of the present invention.
Figure 9:
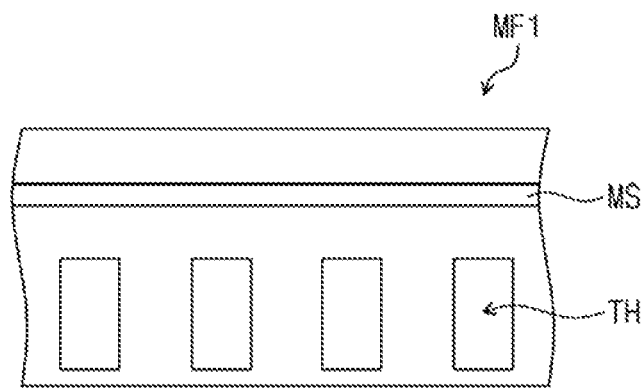
FIG. 9 is a side view showing a mold frame when viewed from an inner side of the display device shown in FIG. 6, according to an exemplary embodiment of the present invention.
Figure 10:
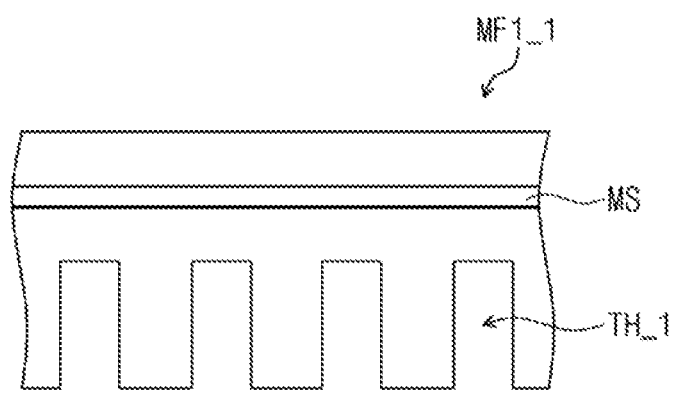
FIG. 10 is a side view showing a mold frame when viewed from an inner side of the display device shown in FIG. 8, according to an exemplary embodiment of the present invention.

FIG. 8 is a cross-sectional view showing a display device, according to an exemplary embodiment of the present invention. FIG. 9 is a side view showing a mold frame when viewed from an inner side of the display device shown in FIG. 6, according to an exemplary embodiment of the present invention. FIG. 10 is a side view showing a mold frame when viewed from an inner side of the display device shown in FIG. 8, according to an exemplary embodiment of the present invention. FIGS. 9 and 10 show the first frame portions MF1 and MF1_1 when viewed from the inner side of the display devices DA_2 and DA_3.

A display device DA_3, as shown in FIG. 8, has the same structure and function as that of the display device DA_2 described with reference to FIGS. 5 to 7 except for a thru-hole TH_1 of a first frame portion MF1_1. For example, the first frame portion MF1 shown in FIG. 5 may have the shape as shown in FIG. 9. The first frame portion MF1 shown in FIG. 9 includes the thru-hole TH having the rectangular shape corresponding to the semiconductor part 520 to allow the semiconductor part 520 to pass through the thru-hole TH. The shape of the semiconductor part 520 should not be limited thereto or thereby. For example, the thru-hole TH may have various shapes such as a circular shape, a polygonal shape, an oval shape, an elliptical shape, and the like.

The thermoelectric device 500 is disposed adjacent to the bottom chassis BC in the display device DA_3 shown in FIG. 8, similar to the thermoelectric device 500 shown in FIG. 5. The first frame portion MF1_1 shown in FIG. 8 may have the same shape as that shown in FIG. 10. The first frame portion MF1_1 shown in FIG. 10 includes a thru-hole TH_1 formed therethrough to have a saw-tooth shape. In an exemplary embodiment of the present invention, the thru-hole TH_1 has an open bottom, as illustrated in FIG. 10. In an exemplary embodiment of the present invention, the first frame portion MF1_1 has a comb shape.

Figure 11:
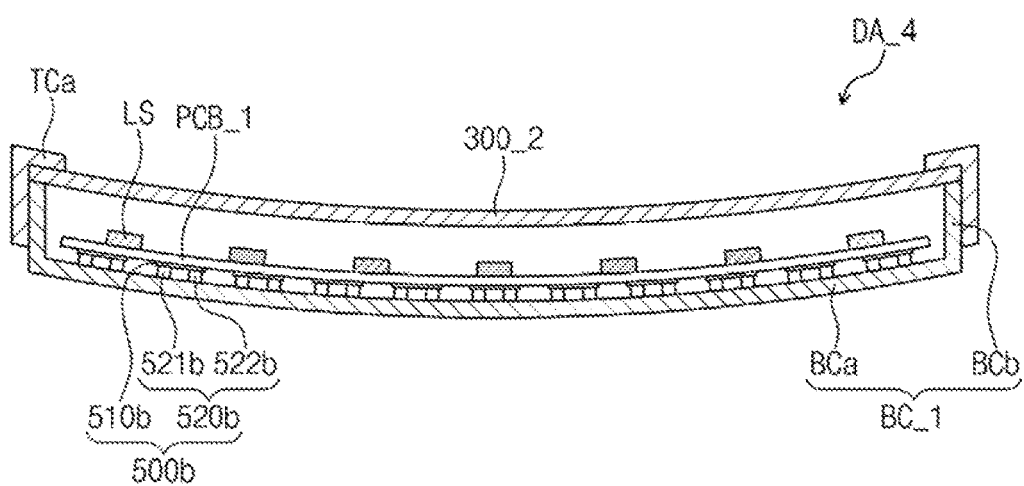
FIG. 11 is a cross-sectional view showing a display device, according to an exemplary embodiment of the present invention.
Figure 12:
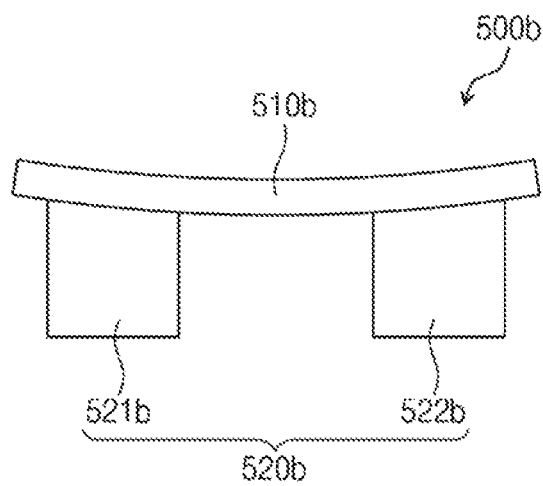
FIG. 12 is an enlarged cross-sectional view showing a thermoelectric device shown in FIG. 11, according to an exemplary embodiment of the present invention.

FIG. 11 is a cross-sectional view showing a display device, according to an exemplary embodiment of the present invention. FIG. 12 is an enlarged cross-sectional view showing a thermoelectric device shown in FIG. 11, according to an exemplary embodiment of the present invention.

Referring to FIG. 11, a display device DA_4 has a predetermined radius of curvature. A display panel 300_2 and an accommodating member BC_1 are curved in the same direction as the display device DA_4.

A printed circuit board PCB_1 has a predetermined radius of curvature and is curved to correspond to the curved shape of the accommodating member BC_1. The accommodating member BC_1 has a predetermined radius of curvature and includes a bottom portion BCa, which is curved, and a sidewall portion BCb extending from the bottom portion BCa.

A heat absorbing substrate 510b of a thermoelectric device 500b has a curved shape to correspond to the radius of curvature of the printed circuit board PCB_1. Accordingly, the heat absorbing substrate 510b may be more easily attached to the printed circuit board PCB_1.

When the heat is applied to the heat absorbing substrate 510b, electrons of an n-type thermoelectric semiconductor 522b move to the accommodating member BC_1 due to heat energy and holes of a p-type thermoelectric semiconductor 521b move to the accommodating member BC_1.

In an exemplary embodiment of the present invention, the thermoelectric device 500b is disposed between the bottom portion BCa and the printed circuit board PCB_1. Therefore, the semiconductor part 520b is coupled to the bottom portion BCa. Although not shown in figures, a metal wire may be disposed on the bottom portion BCa to connect thermoelectric devices. According to an exemplary embodiment of the present invention, the bottom portion BCa may be provided with a groove formed therein. The semiconductor part 520b may be inserted into the groove.

When the display device DA_4 further includes a light guide plate, the light source unit LU may be disposed between the sidewall portion BCb and the light guide plate. In this case, the semiconductor part 520b may be coupled to the sidewall portion BCb.

Figure 13:
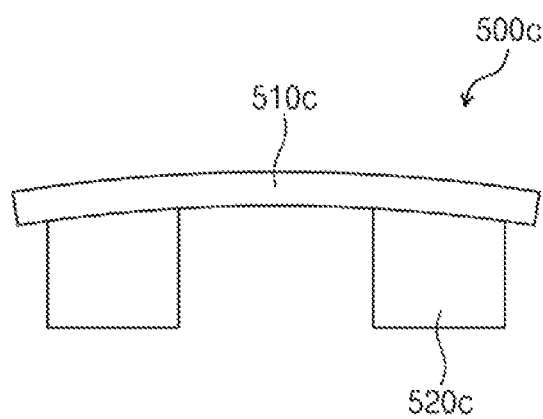
FIG. 13 is an enlarged cross-sectional view showing a thermoelectric device, according to an exemplary embodiment of the present invention.

FIG. 13 is an enlarged cross-sectional view showing a thermoelectric device, according to an exemplary embodiment of the present invention.

Referring to FIG. 13, a thermoelectric device 500c may be applied to a display device curved in an opposite direction with respect to the direction in which the display device shown in FIG. 12 is curved. For example, the display area of the display device shown in FIG. 11 has a concave shape, but the display area of the display device to which the thermoelectric device 500c shown in FIG. 13 is applied has a convex shape.

As shown in FIG. 13, since a heat absorbing substrate 510c of the thermoelectric device 500c has a shape similar to the shape (e.g., curved shape) of an area to which the heat absorbing substrate 510c is attached, the heat absorbing substrate 510c may be more easily attached to the heat source. When the thermoelectric device 500c is operated, a difference in temperature between a first end of a semiconductor part 520c, which is attached to the heat absorbing substrate 510c, and a second end of semiconductor part 520c, which is connected to the heat sink, increases. Accordingly, the efficiency of the thermoelectric device 500c may be increased.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A display device comprising:
   a display panel displaying an image;
   a light source unit providing light to the display panel;
   a light guide plate disposed under the display panel, the light guide plate guiding the light provided from the light source unit to the display panel;
   a cover member covering a portion of an upper surface of the display panel and a side surface of the display panel, wherein the cover member exposes a display area of the display panel and wherein the cover member comprises a cover portion covering the portion of the upper surface of the display panel, and a sidewall portion extending from the cover portion along the side surface of the display panel; and
   a thermoelectric device disposed between the cover member and the light source unit, wherein the thermoelectric device contacts the cover member, and wherein the thermoelectric device generates an electromotive force due to a difference in temperature between the light source unit and the cover member,
   wherein the thermoelectric device comprises a heat absorbing substrate absorbing heat generated from the light source unit, and a semiconductor part disposed between the heat absorbing substrate and the cover member, and
   wherein the light source unit is disposed between the sidewall portion and the light guide plate, and wherein the semiconductor is coupled to the sidewall portion.

2. The display device of claim 1, wherein the light source unit comprises:
   a light source emitting the light; and
   a printed circuit board on which the light source is disposed, wherein the heat absorbing substrate directly contacts the printed circuit board.

3. The display device of claim 1, wherein the cover member comprises a metal material.

4. The display device of claim 1, further comprising an extrusion bar disposed between the light source unit and the sidewall portion, wherein the extrusion bar supports the light source unit, and wherein the heat absorbing substrate directly contacts the extrusion bar.

5. The display device of claim 1, further comprising a mold frame disposed under the display panel supporting a non-display area of the display panel, wherein the mold frame comprises:
   a first frame portion disposed between the light source unit and the sidewall portion; and
   a second frame portion extending from the first frame portion and disposed along a side surface of the light guide plate, wherein the semiconductor part is coupled to the sidewall portion after passing through the first frame portion.

6. The display device of claim 1, wherein the sidewall portion comprises a groove receiving the semiconductor part.

7. The display device of claim 1, wherein the thermoelectric device is directly connected to the cover member and the light source unit.

8. A display device comprising:
   a self-emissive display panel displaying an image;
   an accommodating member accommodating the self-emissive display panel; and
   a thermoelectric device disposed between the self-emissive display panel and the accommodating member,
   wherein the thermoelectric device is disposed between the self-emissive display panel and the accommodation member and coupled to the accommodating member,
   wherein the thermoelectric device generates an electromotive force due to a difference in temperature between the self-emissive display panel and the accommodating member, wherein the thermoelectric device includes a heat absorbing substrate connected to the self-emissive display panel, and a semiconductor part including an n-type thermoelectric semiconductor and a p-type thermoelectric semiconductor, wherein the n-type thermoelectric semiconductor and the p-type thermoelectric semiconductor are connected to the heat absorbing substrate and the accommodating member, and
   wherein the accommodating member comprises a metal material and a groove receiving the semiconductor part of the thermoelectric device.

9. The display device of claim 8, wherein the heat absorbing substrate absorbs heat generated from the self-emissive display panel.

10. The display device of claim 9, wherein the accommodating member comprises:
    a bottom portion; and
    a sidewall portion extending from the bottom portion.

11. The display device of claim 10, wherein the thermoelectric device is disposed under the self-emissive display panel, the thermoelectric device being disposed between the self-emissive display panel and the bottom portion.

12. The display device of claim 10, wherein the thermoelectric device is disposed on a side surface of the self-emissive display panel, the thermoelectric device being disposed between the self-emissive display panel and the sidewall portion.

13. The display device of claim 9, wherein the heat absorbing substrate directly contacts the self-emissive display panel.

14. The display device of claim 9, wherein the heat absorbing substrate is spaced apart from the self-emissive display panel.

15. A display device comprising:
    a display panel that displays an image;
    a light source unit that provides light to the display panel;

a light guide plate disposed under the display panel to guide the light provided from the light source unit to the display panel;

an accommodating member accommodating the display panel and the light source unit, wherein the accommodating member comprises a bottom portion and a sidewall portion extending from the bottom portion; and a thermoelectric device disposed between the accommodating member and the light source unit, wherein the thermoelectric device contacts the accommodating member, wherein the thermoelectric device generates an electromotive force in response to a difference in temperature between the light source unit and the accommodating member, and wherein the light source unit is disposed between the sidewall portion and the light guide plate, wherein the thermoelectric device is coupled to the sidewall portion.

16. The display device of claim 15, wherein the accommodating member comprises:

a metal material.

\* \* \* \* \*